US012750259B2

(12) United States Patent
Shay

(10) Patent No.: US 12,750,259 B2
(45) Date of Patent: Sep. 29, 2026

(54) TECHNIQUES TO MITIGATE DRIFT IN BIAS VOLTAGES

(71) Applicant: Micron Technology, Inc., Boise, ID (US)

(72) Inventor: Michael John Shay, Fairview, TX (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 19/051,789

(22) Filed: Feb. 12, 2025

(65) Prior Publication Data

US 2025/0373473 A1 Dec. 4, 2025

Related U.S. Application Data

(60) Provisional application No. 63/654,246, filed on May 31, 2024.

(51) Int. Cl.
*H04L 25/03* (2006.01)
*H03M 1/66* (2006.01)

(52) U.S. Cl.
CPC ........ *H04L 25/03057* (2013.01); *H03M 1/66* (2013.01); *H04L 25/03267* (2013.01)

(58) Field of Classification Search
CPC ....... H04L 25/03057; H04L 25/03267; H04W 52/20; H04W 52/225; H04B 1/123; H04B 10/40; H04B 3/145; H04B 10/2581; H04B 10/2513; H04B 3/04; H04B 1/16; H04B 1/30
See application file for complete search history.

(56) References Cited

U.S. PATENT DOCUMENTS

| | | | | |
|---|---|---|---|---|
| 2010/0194611 A1* | 8/2010 | Kibune | .................... | H04B 3/04 341/118 |
| 2020/0374160 A1* | 11/2020 | Wang | .................... | H04L 5/0048 |
| 2025/0088395 A1* | 3/2025 | Jose | .................. | H04L 25/03057 |
| 2025/0192851 A1* | 6/2025 | Grossmann | ............... | G06T 7/55 |
| 2025/0210077 A1* | 6/2025 | Seo | ...................... | G11C 7/1048 |

* cited by examiner

*Primary Examiner* — Eva Y Puente
(74) *Attorney, Agent, or Firm* — Fletcher Yoder, P.C.

(57) ABSTRACT

A memory device includes a resistor string digital to analog convertor (DAC) configured to supply one or more offset voltages to a decision feedback equalizer (DFE) based on high and low bias voltages. The memory device also includes bias voltage generation circuitry configured to generate a reference current based on an offset voltage range trim, to generate a first correction current based on a detected temperature change, generate a second correction current based on a supplied voltage, the reference voltage of the memory device, and a supply correction trim, to generate an adjusted reference current based on the reference current, the first correction current, and the second correction current, to generate the high bias voltage based on the adjusted reference current, to generate the low bias voltage based on the reference current, and to supply the high bias voltage and the low bias voltage to the resistor string DAC.

20 Claims, 6 Drawing Sheets

TECHNIQUES TO MITIGATE DRIFT IN BIAS VOLTAGES

CROSS-REFERENCE TO RELATED APPLICATIONS

This application claims priority to U.S. Provisional Application No. 63/654,246, filed May 31, 2024, which is incorporated by reference herein in its entirety.

BACKGROUND OF THE INVENTION

Field of the Invention

The present invention relates generally to memory devices. More particularly, the present disclosure relates to mitigating variation in bias voltages used by memory devices.

Description of the Related Art

The operational rate of memory devices, including the data rate of a memory device, has been increasing over time. As a side effect of the increase in speed of a memory device, data errors due to distortion may increase. For example, inter-symbol interference between transmitted data whereby previously received data influences the currently received data may occur (e.g., previously received data affects and interferes with subsequently received data). One manner to correct for this interference is through the use of a decision feedback equalizer (DFE) circuit, which may be programmed to offset (i.e., undo, mitigate, or offset) the effect of the channel on the transmitted data.

A DFE circuit may offset channel effects based on one or more voltages (e.g., offset voltages, bias voltages) supplied to the DFE circuit. For example, the DFE circuit may use a bias voltage supplied by voltage generation circuitry as a reference threshold for making decisions. However, changes in process, voltage, and temperature (PVT) characteristics may cause undesired variations (e.g., drift) in a supplied reference voltage, which may compromise decision making performance of the DFE.

DETAILED DESCRIPTION OF SPECIFIC EMBODIMENTS

Figure 1:
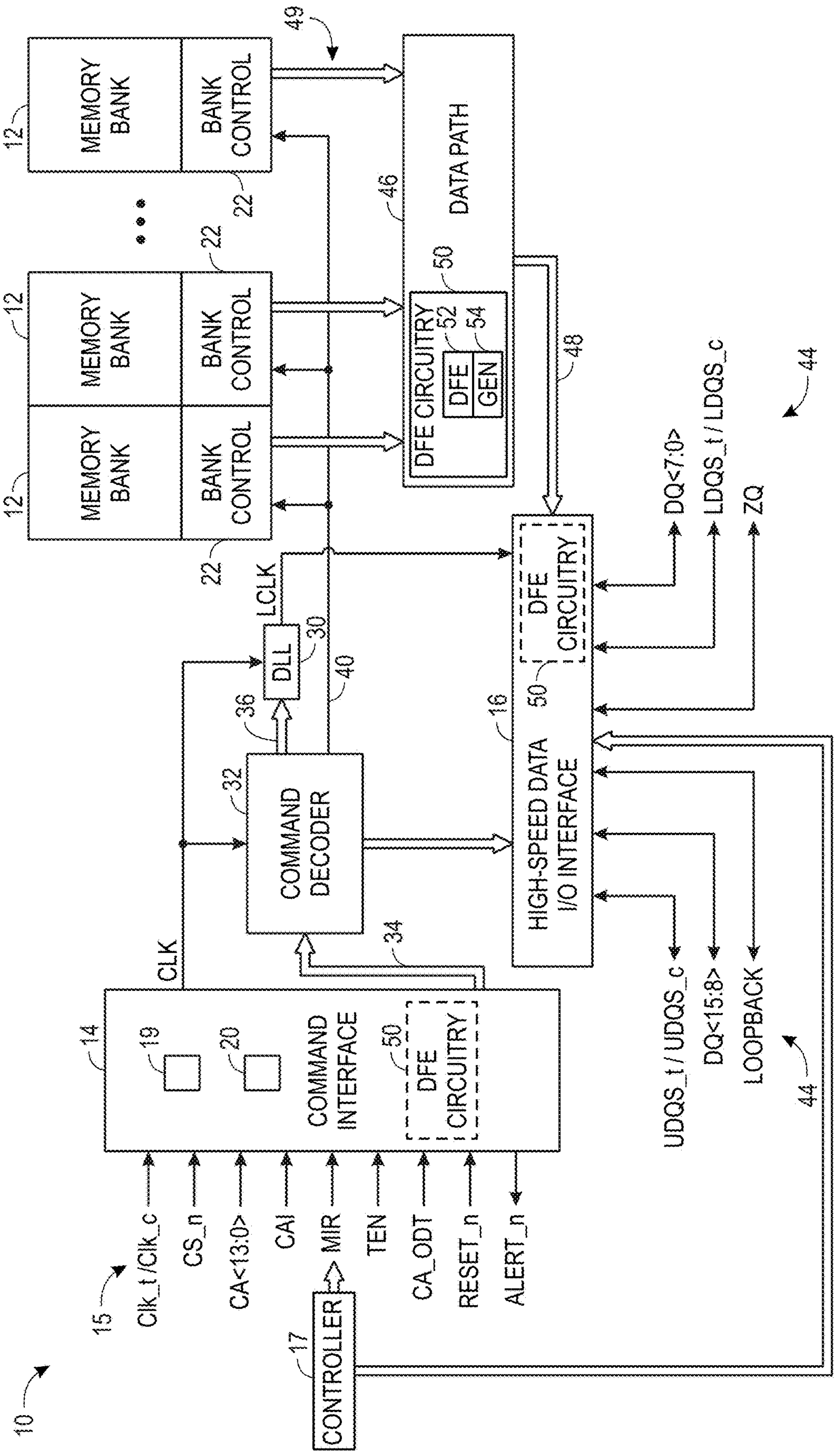
FIG. 1 is a simplified block diagram illustrating certain features of a memory device having a decision feedback equalizer (DFE) circuitry that includes a DFE that determines a level for data received by the memory device and includes bias voltage generation circuitry, in accordance with an embodiment.

As mentioned, DFE circuitry of a memory device may be programmed to offset (i.e., undo, mitigate, or offset) the effect of the channel on the transmitted data using one or more offset voltages. For example, after a received signal passes through equalization filters of the DFE circuitry, the signal may be compared to the offset voltage to determine an intended symbol (e.g., a "1" or a "0"). This determination may mitigate intersymbol interference (ISI) by distinguishing between an intended symbol and noise or interference. Further, determinations made based on the offset voltage may be used to generate feedback signals that may be combined with incoming signals, mitigating distortion caused by changing channel conditions.

To more effectively mitigate interference, accurately discern between different symbols, and reject noise, an offset voltage value may be chosen and/or adjusted based on characteristics of a channel. An offset voltage value may be chosen based on techniques that evaluate performance of a system with different offset voltages, such as bit error rate (BER) analysis or rank margin analysis. However, during operation, an offset voltage may drift away from a chosen offset voltage value in response to variations in process, voltage, or temperate (PVT) characteristics of components that supply the offset voltage. Further, maintaining a desired offset voltage value may be made challenging by considerable non-linear variation across PVT characteristics present in receiver topologies of DFE circuitry. Mitigating such variations may allow a stable offset voltage.

Systems and methods described herein include voltage generation circuitry that generates a high bias voltage and a low bias voltage to be supplied to DFE circuitry. The voltage generation circuitry may include temperature correction circuitry that generates a temperature adjustment current based on a detected temperature and a temperature correction trim. The voltage generation circuitry may also include supply correction circuitry that generates a supply adjustment current based on a supplied voltage and a supply correction trim. The voltage generation circuitry may add the temperature adjustment current and/or the supply adjustment current to a reference current to form an adjusted reference current.

The adjusted reference current may be applied to a first replica n-channel metal-oxide semiconductor (NMOS) transistor and a degenerated resistor to form the high bias voltage. The first replica NMOS transistor may replicate (e.g., have the same or similar electrical characteristics) as an offset generation NMOS transistor that may be used in receiver circuitry of a memory device. Similarly, the degenerated resistor may have a configurable resistance that causes a voltage drop that replicates an effective voltage ($V_{gs}-V_T$) of the offset generation NMOS transistor. Additionally, the reference current may be applied to a second replica NMOS transistor that similarly replicates the offset generation NMOS transistor to form the low bias voltage. The high bias voltage and the low bias voltage may be applied to terminals of a receiver circuitry, such as a DAC that supplies offset voltages to DFE circuitry.

The temperature correction circuitry and the supply correction circuitry may adjust the temperature adjustment current and the supply adjustment current to account for non-linear variations across PVT characteristics of receiver topologies associated with DFE circuitry. For example, the voltage generation circuitry may act as a finite-impulse response (FIR) filter with variable inputs and programmable coefficients that cause a change in the high bias voltage and the low bias voltage. The variable inputs may include, for example, process, voltage, and supply variations, and the programmable coefficients may include the temperature correction trim input to the temperature correction circuitry and the supply correction trim input to the supply correction circuitry. As such, the voltage generation circuitry may mitigate variations in offset voltage values due to non-linear variations across PVT characteristics present in the DFE circuitry.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips). Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organizations, and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a processor or controller 17. The processor or controller 17 may provide various signals 15 to the memory device 10 to facilitate the transmission and receipt of data to be written to or read from the memory device 10.

The command interface 14 may include a number of circuits, such as a clock input circuit 19 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 19 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes multiple bi-directional data buses. Data IO signals, generally referred to as DQ signals, are generally transmitted and received in one or more bi-directional data buses. The datapath 46 may convert the DQ signals from a serial bus 48 to a parallel bus 49.

For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS signals are driven by the controller 17 to the memory device 10 to strobe in write data. When the write operation is complete, the controller 17 will stop driving the DQS and allow it to float to an indeterminate tri-state condition. When the DQS signal is no longer driven by the controller 17, the external DQS signal from the controller 17 to the memory device 10 will be at an unknown/indeterminate state. This state can cause undesirable behavior inside the memory device 10 because an internal DQS signal inside the memory device 10 may be at an intermediate level and/or may oscillate. In some embodiments, even the external DQS signal may ring at the I/O interface 16 when the controller 17 stops driving the external DQS signal.

The DDR5 specification may include a short postamble period where the external DQS signal is still driven by the controller 17 after the last write data bit to allow time for disabling of write circuitry to propagate before the controller 17 ceases to drive the external DQS signal. The DDR5 specification may define a short (e.g., 0.5 tCK) postamble period and a long (e.g., 1.5 tCK) postamble period that may be selected using a mode register. However, the short postamble period may provide a short period of time to reset a DFE buffer.

Returning to FIG. 1, an impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

DDR5 allows write operations to be performed consecutively such that data entry is gapless between two consecutive writes. In this case, the normal postamble for the first write operation and/or the normal preamble for the second write operation may be completely eliminated. For some consecutive write operations, there may be cycle gaps having a certain gap (e.g., 1, 2, 3, or more cycles) between the data burst of the first write operation and the data burst of the second write operation. For these cases, there may be a specified partial postamble and/or partial preamble to support these operations.

In some consecutive write operations, the spacing between the first write operation and the second write operation is such that the entire first postamble and second preamble is met and there may even be additional clock cycles in between the two write operations. When there are additional clock cycles in between the first postamble and second preamble, the DQS strobe may be disabled (float) or driven depending on the specification. Thus, decision feedback equalizer (DFE) circuitry 50 may reset a DFE 52 at the end of a write burst using reset circuitry when sufficient time to reset occurs between write operations, but the reset may be at least partially suppressed when there is insufficient time (e.g., less than 2 DQS cycles) between write operations. As noted below, when the DFE reset is suppressed at the end of a write burst, the DFE buffer may instead be populated using data strobed in using the available DQS cycles. For example, in a suppression of a reset of a 4-bit DFE buffer when 2 DQS cycles occur between write operations, 4 bits (on rising and falling edges of the DQS cycles) of "not live" data existing on the data line may be written into the DFE buffer. Moreover, in a suppression of a reset of a 4-bit DFE buffer when only a single cycle occurs between write operations, 2 bits (on rising and falling edges of the DQS cycle) may be written into the DFE buffer even though the buffer may only be halfway overwritten with "not live" data.

The datapath 46, the I/O interface 16, and/or the command interface 14 may include the DFE circuitry 50 that uses the DFE 52 that includes an input buffer of a number (e.g., 4) of previous bits (e.g., high or low) that may be used to interpret incoming data bits in data IO signals, generally referred to as DQ signals. The DFE circuitry 50 uses the previous levels in the DQ signals to increase accuracy of interpreting incoming bits in the DQ signals. The DFE input buffer depends upon tracking the previous input history on the channel to decide which input tap to use for a next data input. For gapless writes or writes spaced with a toggling interamble between the writes due to insufficient time to complete the interamble (e.g., post-amble from an earlier write of consecutive writes and a pre-amble from a later write of the consecutive writes) or a defined toggling, the DFE 52 may continuously update and track every data bit on the channel. For writes spaced far enough apart that they have a non-toggling interamble, the DFE 52 will not update during the non-toggling time between writes, and its registers will become invalid for use in collecting the first data bits after the interamble. In some embodiments, the non-toggling interamble may occur when a specified toggling has occurred between writes or may be specified as containing no toggles. In some embodiments, a specification for the memory device 10 may define that a non-toggling interamble is held to a specified value (e.g., data high) so that the channel history can be known by the memory device 10 even though the channel history is not being collected by the memory device 10. The memory device 10 may update the DFE history to the value without data collection during the non-toggling portion of the interamble by using a reset of the DFE 52 to make the registers reset to a specified (e.g., all high data) state.

As mentioned, to interpret incoming signals as bits, the DFE 52 may make one or more decisions based on a threshold offset voltage. For example, the DFE 52 may compare the incoming signals to a threshold offset voltage. The DFE circuitry may include bias voltage generation circuitry 54 (also referred to as offset voltage generation circuitry) that generates one or more offset voltages used by the DFE 52. Further, the bias voltage generation circuitry 54 may generate a certain offset voltage based on a configuration of the DFE 52, such as a size of the input buffer of previous bits of the DFE 52.

Figure 2:
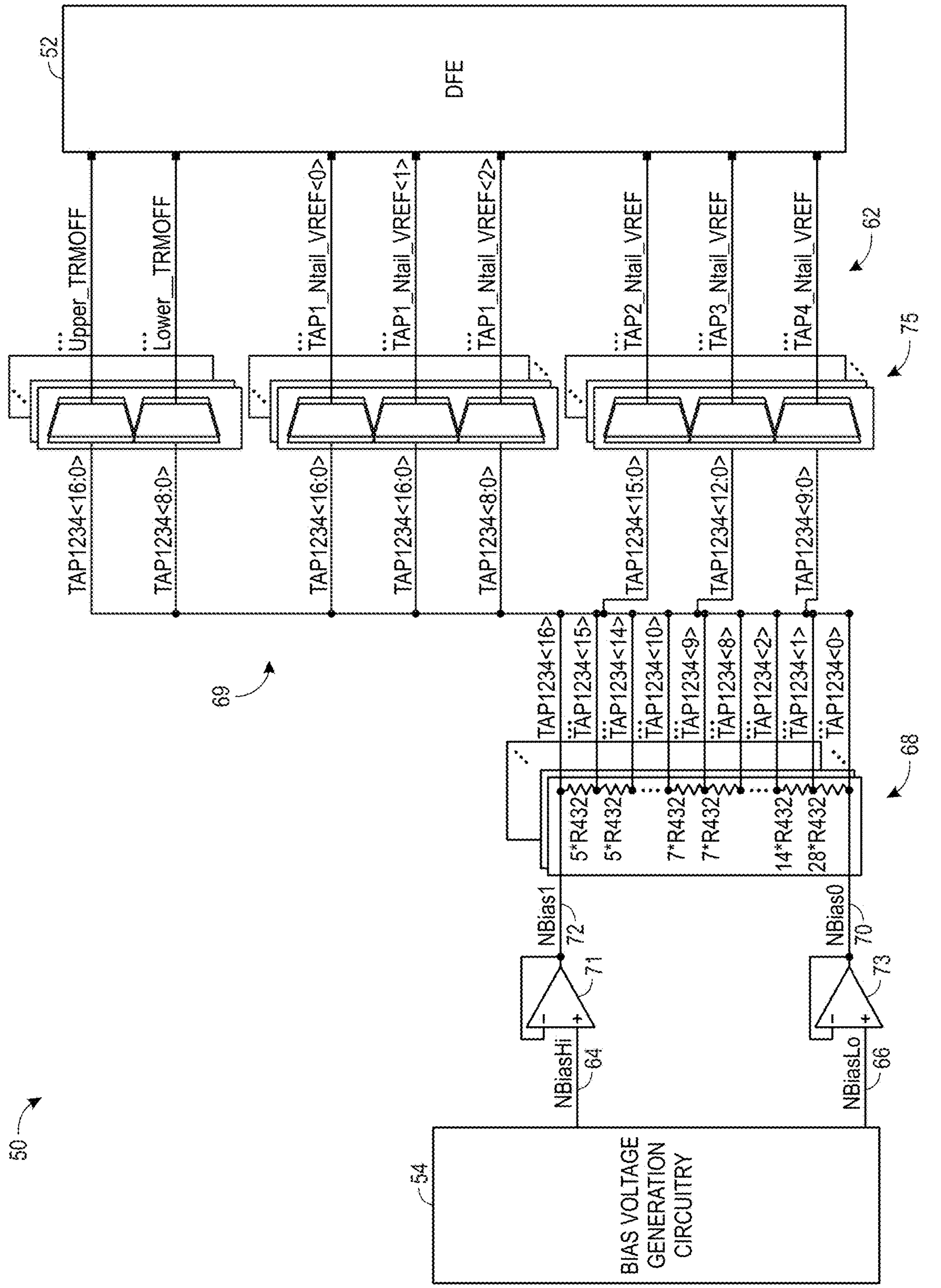
FIG. 2 is a schematic diagram of the DFE circuitry of FIG. 1, including a resistor string digital to analog (DAC) converter, in accordance with an embodiment.

FIG. 2 is a schematic diagram of an embodiment of the DFE circuitry 50, including the bias voltage generation circuitry 54 that is used to generate one or more offset voltages 62 used by the DFE 52. While the DFE circuitry 50 in FIG. 2 is shown as an example DFE circuitry, the DFE circuitry 50 may include or be communicatively coupled to various receiver topologies. That is, the DFE circuitry 50 may be receiver-agnostic. In the illustrated embodiment, the bias voltage generation circuitry 54 may generate a high bias voltage 64 and a low bias voltage 66 that are each supplied to a resistor string DAC 68 via buffers 71 and 73, respectively. The resistor string DAC 68 may include a set of resistors with a voltage gradient that may be determined based on the low bias voltage 70 and the high bias voltage 72. Based on the voltage gradient of the set of resistors and one or more digital inputs, the resistor string DAC 68 may generate one or more taps 69 for multiplexer circuitry 75, and the multiplexer circuitry 75 may provide offset voltages 62 for the DFE 52 based on (e.g., by decoding) the one or more taps 69. For example, the multiplexer circuitry 75 may include a corresponding multiplexer cell for each of the taps 69 generated by the resistor string DAC 69, and each of the corresponding multiplexer cells may provide an offset voltage of one or more offset voltages 62 to the DFE 52. Each of the taps 69 may correspond to an input tap used by the DFE 52, as described with reference to FIG. 1, and the multiplexer circuitry 69 may provide an offset voltage corresponding to the input tap.

During operation, components of the DFE circuitry 50 experience variations in process, voltage, and temperature (PVT) characteristics, which may compromise stability of the offset voltages 62. Components of the DFE circuitry 50 may include numerous electrical components that may have manufacturing variations, oxide thickness variations, channel lengths, metal thicknesses, and so on, that may alter, for example, a target offset voltage 62 or a produced offset voltage 62. Additionally, resistors of the bias voltage generation circuitry 54 may experience a change in temperature (e.g., due to heat generated by nearby components) that may cause a change in an electrical characteristic produced based on the resistors, such as the high bias voltage 64 or the low bias voltage 66. Further, a supply voltage supplied to the bias voltage generation circuitry 54 may vary throughout operation because of supply noise caused by parasitic conductance, resistance variations between metals conducting the supply voltage, and so on, which may alter electrical characteristics produced by or within the DFE circuitry 50. For the techniques described herein, process variations may be described as first order, and temperature and voltage variations (e.g., supply variations) may be described as second order. That is, an electrical circuit subject to process variations may be analyzed using a first-order differential equation, and electrical circuits subject to temperature and/or voltage variations may be analyzed using second-order differential equations.

Figure 3:
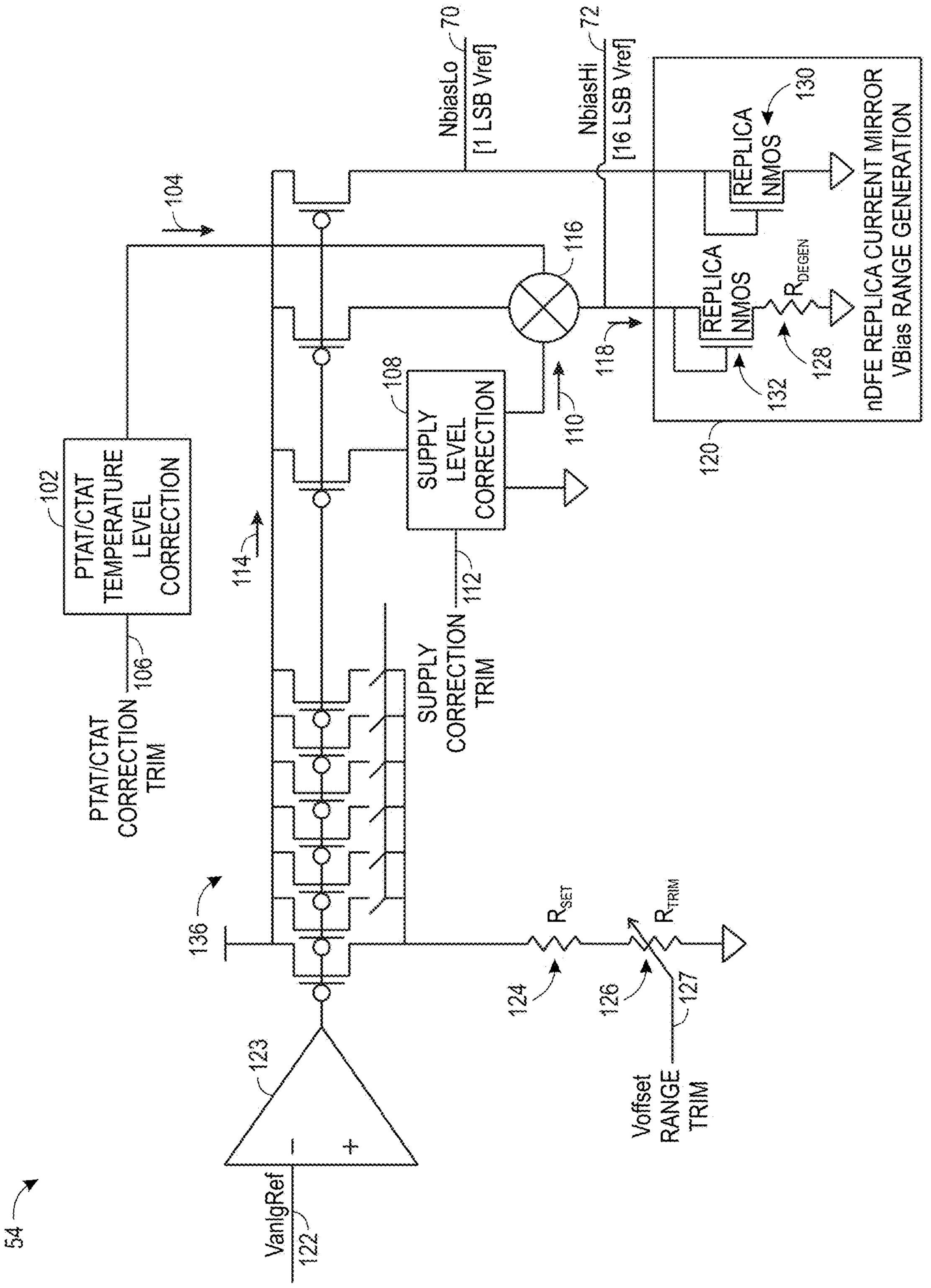
FIG. 3 is a schematic diagram of the bias voltage generation circuitry of FIG. 1 that generates a high bias voltage and a low bias voltage and includes temperature correction circuitry and supply correction circuitry, in accordance with an embodiment.

FIG. 3 is a schematic diagram of the bias voltage generation circuitry 54 that generates the high bias voltage 70 and the low bias voltage 72. The voltage generation circuitry 54 may include temperature correction circuitry 102 that generates a temperature adjustment current 104 based on a detected temperature and a temperature correction trim 106, as will be described below. The bias voltage generation circuitry 54 may also include supply correction circuitry 108 that generates a supply adjustment current 110 based on a supplied voltage and a supply correction trim 112. The temperature adjustment current 104 and the supply adjustment current 110 may act as coefficients of a reference current 114 in the illustrated embodiment. In particular, the bias voltage generation circuitry 54 may add the temperature adjustment current 104 and the supply adjustment current 110 to the reference current 114 at a node 116 to form an adjusted reference current 118. The node 116 may, for example, include a current summer device 116 that outputs a current value equivalent to the sum of the temperature adjustment current 104, the supply adjustment current 110, and the reference current 114. The reference current 114 and the adjusted reference current 118 may each be applied to replica DFE circuitry 120 (e.g., a current mirror) to form the high bias voltage 72 and the low bias voltage 70.

In the illustrated embodiment, the reference current 114 is applied to a first replica NMOS transistor 130 to generate the low bias voltage 70. In some embodiments, the reference current 114 may be adjusted according to additional parameters, such as by summing the reference current 114 with an additional temperature-adjustment current before being applied to the first replica NMOS transistor 130. In some embodiments, this summation is used for generating the high bias voltage 72 but not the low bias voltage 70 while in some embodiments this summation may be performed for generation of both the high bias voltage 72 and the low bias voltage 70. The adjusted reference current 118 is applied to second replica NMOS transistor 132 coupled in series with an $R_{DEGEN}$ resistance 128 to generate the high bias voltage 72. The first replica NMOS transistor 130 and the second replica NMOS transistor 132 may each replicate (e.g., have the same or similar characteristics) as an offset generation NMOS transistor that may be used in receiver circuitry of a memory device, such as the DFE circuitry 50 of the memory device 10. Similarly, the $R_{DEGEN}$ resistance 128 may have a configurable resistance that causes a voltage drop that replicates an effective voltage ($V_{gs}-V_T$) of the offset generation NMOS transistor. As such, the replica DFE circuitry 120 may replicate circuitry and effective voltages present in the DFE circuitry 50 or other receiver circuitry. Accordingly, the high bias voltage 72 and the low bias voltage 70 may be applied to terminals of a receiver circuitry, such as a DAC that supplies offset voltages to DFE circuitry. In the illustrated embodiment, the high bias voltage 72 is generated within a least significant bit (LSB) resolution of 16 with respect to a reference voltage, and the low bias voltage is generated within an LSB resolution of 1 with respect to the reference voltage. However, other embodiments are envisioned. For example, the high bias voltage may be generated with an LSB resolution of 40 or greater.

The reference current 114 may be generated based on a bandgap voltage 122 supplied to an amplifier 123 and an $R_{SET}$ resistance 124 arranged in series with an adjustable $R_{TRIM}$ resistor 126. The $R_{SET}$ resistance 124 may vary with temperature, which may cause a change in the reference current 114. However, the $R_{SET}$ resistance 124 may be part of the same resistance network and/or may be closed in close proximity to the $R_{DEGEN}$ resistance 128 such that temperate changes to the $R_{SET}$ resistance 124 similarly affect the $R_{DEGEN}$ resistance 128. As such, effects of temperature changes to the $R_{SET}$ resistance 124 may be accounted for, and temperature effects on the reference current 114 may be mitigated. As such, the reference current may be generated with only first-order variations (e.g., process variations).

As illustrated, the resistance of the $R_{TRIM}$ resistor 126 may be adjusted by a Voffset range trim 127. The Voffset range trim 127 may be adjusted based on an evaluation of process variations (e.g., first order variations), as described herein, and may reflect a threshold voltage used by the DFE. For example, the Voffset range trim 127 may be based on a threshold voltage used by the DFE to discern between symbols. In the illustrated embodiment, the bias voltage generation circuitry 54 also includes programmable circuitry 136 that may adjust a gain based on a desired offset voltage as determined by, for example, operational specifications of a communicatively connected DRAM component.

Figure 4:
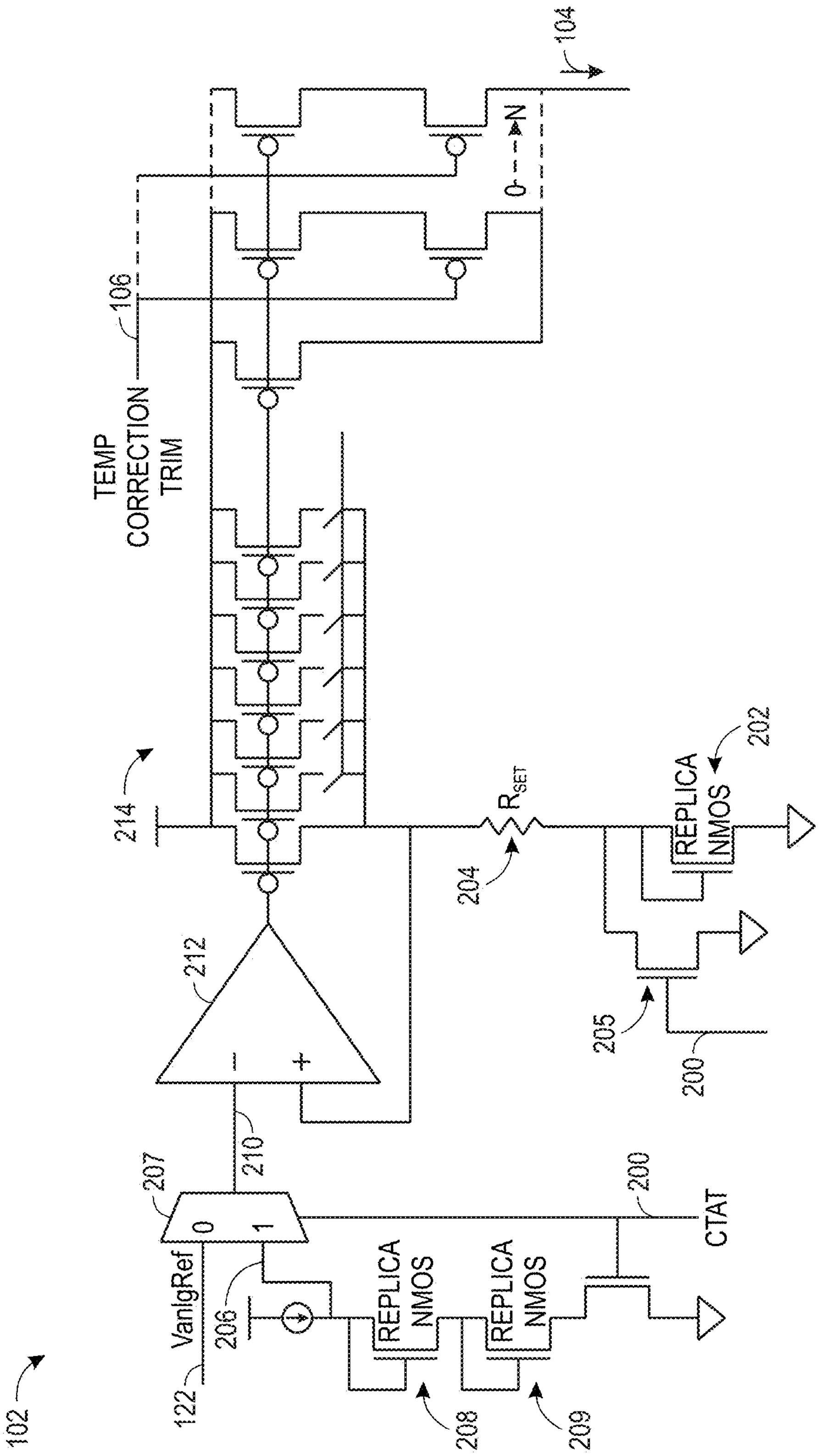
FIG. 4 is a schematic diagram of the temperature correction circuitry of FIG. 3 that generates a temperature adjustment current, in accordance with an embodiment.

To correct for second-order temperature variations, the bias voltage generation circuitry 54 includes temperature correction circuitry 102. FIG. 4 is a schematic diagram of the temperature correction circuitry 102 that generates a temperature adjustment current 104 based on a detected temperature and a temperature correction trim 106. In the illustrated embodiment, the temperature correction circuitry 102 may operate in a proportional to absolute temperature (PTAT) mode or a complementary to absolute temperature (CTAT) mode. When operating in the PTAT mode, the temperature adjustment current 104 may be proportional to a detected temperature change (e.g., as detected by a replica NMOS transistor 202), and when operating in the CTAT mode, the temperature adjustment current 104 may be inversely proportional (e.g., complementary) to a detected temperature change.

In the illustrated embodiment, the CTAT mode or the PTAT mode may be selected based on the assertion of mode selection inputs 200. A multiplexer 207 may select, based on the mode selection inputs 200, the bandgap voltage 122 (e.g., a constant voltage) or a CTAT reference 206 that may be inversely proportional to changes in temperature at replica NMOS transistor 208 and replica NMOS transistor 209. When the mode selection inputs 200 are asserted, current may flow thorough the replica NMOS transistor 208 and the replica NMOS transistor 209. As temperature increases in the replica NMOS transistor 208 and the replica NMOS transistor 209, threshold voltages of the replica NMOS transistor 208 and the replica NMOS transistor 209 may decrease, causing a decrease in the CTAT reference 206. As such, when the CTAT reference 206 is selected by the multiplexer 207, a supply voltage 210 supplied to the amplifier 212 may be inversely proportional to a temperature at the replica NMOS transistor 208 and the replica NMOS transistor 209. Accordingly, the temperature adjustment current 104 may decrease with an increase in temperature at the replica NMOS transistor 208 and the replica NMOS transistor 209.

An output of the amplifier 212 may be coupled to an $R_{SET}$ resistance 204, and the $R_{SET}$ resistance 204 may be coupled to a replica NMOS transistor 202 that generates a PTAT reference and to a CTAT NMOS transistor 205 that generates a CTAT reference. When the mode selection input 200 is unasserted and the CTAT NMOS transistor 205 is disconnected, the replica NMOS transistor may generate a PTAT reference to adjust the temperature adjustment current 104. In particular, as temperature increases in the replica NMOS transistor 202, a threshold voltage of the replica NMOS transistor 202 may decrease, causing more current to flow through the $R_{SET}$ resistance 204. Accordingly, the increased current flowing through the $R_{SET}$ resistance 204 may cause an increase in the temperature adjustment current 104. As such, an increase in temperature of the replica NMOS transistor 202 causes a proportional increase in the temperature adjustment current 104. When the mode selection input 200 is asserted, on the other hand, the CTAT NMOS transistor 205 may cause the $R_{SET}$ resistance 204 to be connected to ground (e.g., even if a voltage across the replica NMOS transistor 202 is less than a threshold voltage of the NMOS transistor 202). As such, the temperature adjustment current 104 may be unchanged by changes in temperature at the replica NMOS transistor 202.

In addition to adjustments based on temperature variations, the temperature adjustment current 104 may be adjusted to account for process variations by adjusting the temperature correction trim 106. For example, a gain of the output of the temperature correction circuitry 102 may be adjusted to account for process variations. It should be noted that, while the temperature correction trim 106 is included in the illustrated embodiment to account for potential process variations, in some embodiments, an optimal temperature adjustment current 104 may be generated regardless of process variations (e.g., across processes). In addition, the temperature correction circuitry 102 may include programmable circuitry 214 that, like the programmable circuitry 136, may adjust a gain based on a desired offset voltage as determined by operational specifications of a memory component, for instance. For example, the programmable circuitry 214 may be set using mode registers (MRs) of the memory device 10.

Figure 5:
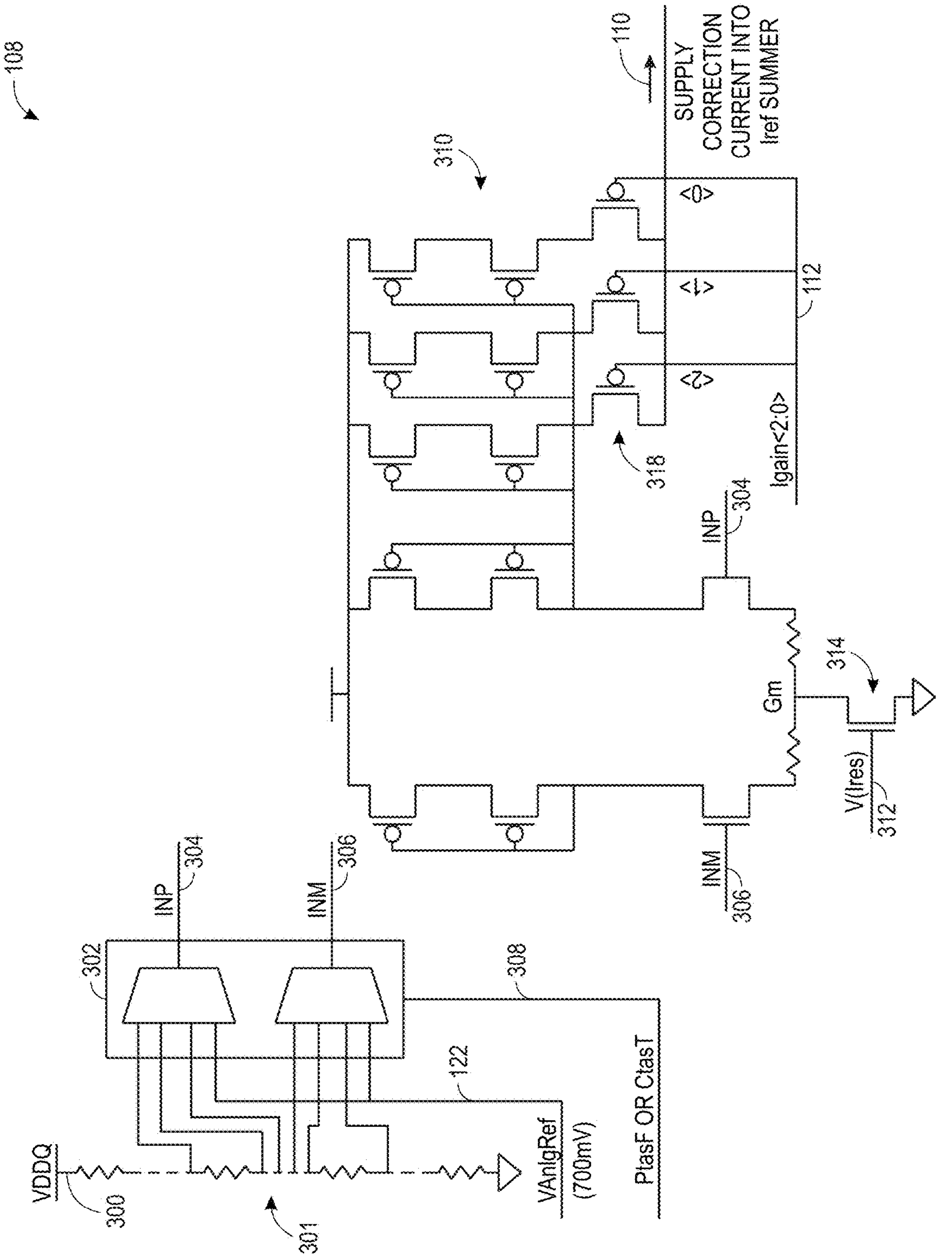
FIG. 5 is a schematic diagram of the supply correction circuitry of FIG. 3 that generates a supply adjustment current, in accordance with an embodiment.

FIG. 5 is a schematic diagram of the supply correction circuitry 108 that generates the supply adjustment current 110 based on a supplied voltage 300 and a supply correction trim 112. In the illustrated embodiment, the supply correction circuitry 108 includes multiplexer circuitry 302 that produces a plus voltage 304 and a minus voltage 306 based on the bandgap voltage 122, the supplied voltage 300, and mode selection signals 308. A linear operational transconductance amplifier (OTA) 310 may generate the supply adjustment current 110 based on the plus voltage 304, the minus voltage 306, and an $R_{SET}$ voltage 312.

The multiplexer circuitry 302 may select the supplied voltage 300 and/or the bandgap voltage 122 based on the selection signals 308, which may define an operational state of the supply correction circuitry 108. For example, the selection signals 308 may define a proportional mode, in which the supply adjustment current 110 is proportional to the supplied voltage 300, and a complementary mode, in which the supply adjustment current is inversely proportional to the supplied voltage 300. Based on the selection signals 308, the multiplexer circuitry 302 may select the bandgap voltage 122 or voltages at nodes between resistors of a resistor string 301 coupled to the supplied voltage 300 to be produced as the plus voltage 304 and the minus voltage 306.

Based on a difference between the plus voltage 304 and the minus voltage 306, the linear OTA 310 may generate the supply adjustment current 110. In particular, the linear OTA 310 may act as differential-input, single-output OTA that produces linear changes in the supply adjustment current 110 in response to linear changes in a differential between the plus voltage 304 and the minus voltage 306. As such, the supply adjustment current 110 may characterize a difference between the bandgap voltage 122 (e.g., an intended voltage) and the supplied voltage 300 (e.g., a measured voltage).

In addition, the linear OTA 310 may accept, as input, the $R_{SET}$ voltage 312 via a gate terminal of an NMOS transistor 314, and changes in the $R_{SET}$ voltage 312 may cause a change in the supply adjustment current 110. In the illustrated embodiment, the $R_{SET}$ voltage 312 may be dependent on a current flowing through the $R_{SET}$ resistance 124 of FIG. 3 and, as such, the supply adjustment current 110 generated by the linear OTA 310 may take changes in the current flowing through the $R_{SET}$ resistance 124 (e.g., the reference current 114) into account when generating the supply adjustment current 110. In particular, the supply adjustment current 110 may be dependent on the plus voltage 304, the minus voltage 306, and a gain value Gm determined based on the $R_{SET}$ voltage 312.

In addition to adjustments based on supply variations and current flowing through the $R_{SET}$ resistance, the supply adjustment current 110 may be adjusted to account for process variations by adjusting the supply correction trim 112, which may include a current, voltage, or other electrical characteristic. As illustrated, the linear OTA 310 may receive the supply correction trim 112 connected to PMOS transistors 318 that adjust a gain seen at an output node carrying the supply adjustment current 110 to adjust for process variations. While the supply correction trim 112 is included in the illustrated embodiment to account for potential process variations, in some embodiments, an optimal supply adjustment current 110 may be generated regardless of process variations.

Figure 6:
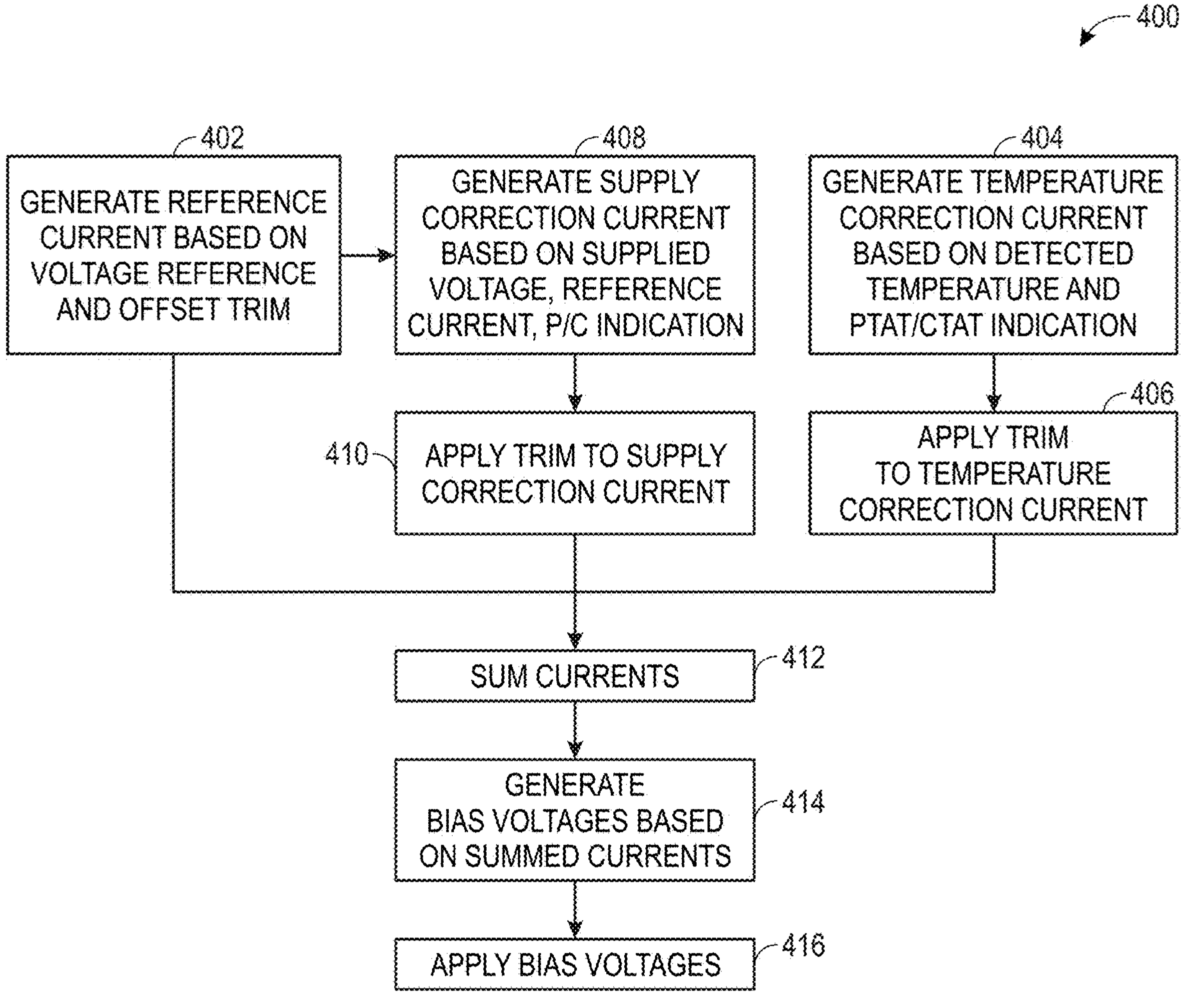
FIG. 6 is a flow chart of a method for generating a low bias voltage and a high bias voltage based on an offset voltage range trim, a detected temperature, a temperature correction trim, a supplied voltage, and a supply correction trim, in accordance with an embodiment.

FIG. 6 is a flow chart of a method 400 for generating a low bias voltage 70 and a high bias voltage 72 based on a Voffset range trim 127, a detected temperature, a temperature correction trim 106, a supplied voltage 300, and a supply correction trim 112. In block 402, the bias voltage generation circuitry 54 may generate a reference current 114 (e.g., a first current) based on a bandgap voltage 122 and an $R_{SET}$ resistance 124 arranged in series with an adjustable $R_{TRIM}$ resistor 126. As mentioned, the $R_{SET}$ resistance 124 may be part of the same resistance network and/or may be closed in close proximity to the $R_{DEGEN}$ resistance 128 such that temperature changes to the $R_{SET}$ resistance 124 similarly affect the $R_{DEGEN}$ resistance 128. As such, effects of temperature changes to the $R_{SET}$ resistance 124 may be accounted for, and temperature effects on the reference current 114 may be mitigated. Further, the resistance of the $R_{TRIM}$ resistor 126 may be adjusted by a Voffset range trim 127. The Voffset range trim 127 may be adjusted based on an evaluation of process variations (e.g., first order variations), as described herein, and may reflect a threshold voltage used by the DFE.

In block 404, the temperature correction circuitry 102 of the offset voltage generation circuitry may generate a temperature adjustment current 104 (e.g., a second current) based on a detected temperature and a temperature correction trim 106. As mentioned, the temperature correction circuitry 102 may operate in a proportional to absolute temperature (PTAT) mode or a complementary to absolute temperature (CTAT) mode. For example, when the CTAT reference 206 is selected by the multiplexer 207, a supply voltage 210 supplied to the amplifier 212 may be inversely proportional to a temperature at the replica NMOS transistor 208 and the replica NMOS transistor 209. Accordingly, the temperature adjustment current 104 may decrease with an increase in temperature at the replica NMOS transistor 208 and the replica NMOS transistor 209. In block 406, the temperature adjustment current 104 may be adjusted to account for process variations by adjusting the temperature correction trim 106. In particular, a gain of the output of the temperature correction circuitry 102 may be adjusted to account for process variations.

In block 408 the supply correction circuitry 108 generates a supply adjustment current 110 (e.g., a third current) based on a supplied voltage and a supply correction trim 112. The multiplexer circuitry 302 may select the supplied voltage 300 and the bandgap voltage 122 based on the selection signals 308, which may define an operational state of the supply correction circuitry 108. For example, the selection signals 308 may define a proportional mode, in which the supply adjustment current 110 is proportional to the supplied voltage 300, and a complementary mode, in which the supply adjustment current is inversely proportional to the supplied voltage 300. Based on the selection signals 308, the multiplexer circuitry 302 may select the bandgap voltage 122 or voltages at nodes between resistors of a resistor string 301 coupled to the supplied voltage 300 to be produced as the plus voltage 304 and the minus voltage 306. Based on a difference between the plus voltage 304 and the minus voltage 306, the linear OTA 310 may generate the supply adjustment current 110. In particular, the linear OTA 310 may act as differential-input, single-output OTA that produces linear changes in the supply adjustment current 110 in response to linear changes in a differential between the plus voltage 304 and the minus voltage 306. As such, the supply adjustment current 110 may characterize a difference between the bandgap voltage 122 (e.g., an intended voltage) and the supplied voltage 300 (e.g., a measured voltage).

As mentioned, the linear OTA 310 may also accept, as input, the $R_{SET}$ voltage 312 via a gate terminal of an NMOS transistor 314, and changes in the $R_{SET}$ voltage 312 may cause a change in the supply adjustment current 110. In the illustrated embodiment, the $R_{SET}$ voltage 312 may be dependent on a current flowing through the $R_{SET}$ resistance 124 of FIG. 3 and, as such, the supply adjustment current 110 generated by the linear OTA 310 may take changes in the current flowing through the $R_{SET}$ resistance 124 (e.g., the reference current 114) into account when generating the supply adjustment current 110. In particular, the supply adjustment current 110 may be dependent on the plus voltage 304, the minus voltage 306, and a gain value Gm determined based on the $R_{SET}$ voltage 312. In block 410, the supply correction circuitry 108 may apply the supply correction trim 112 to the supply adjustment current 110 to account for process variations.

In block 412, the bias voltage generation circuitry 54 may add the temperature adjustment current 104 and the supply adjustment current 110 to the reference current 114 at a node 116 to form an adjusted reference current 118. The node 116 may, for example, include a current summer device that outputs a current value equivalent to the sum of the temperature adjustment current 104, the supply adjustment current 110, and the reference current 114. As such, changes in the temperature adjustment current 104, the supply adjustment current 110, or the reference current 114 (e.g., resulting from adjustments to the temperature correction trim 106 and/or the supply correction trim 112) may cause changes in the adjusted reference current 118.

In block 414, the bias voltage generation circuitry 54 may generate the low bias voltage 70 based on the reference current 114 and the high bias voltage 72 based on the adjusted reference current 118. As described herein, the reference current 114 is applied to a first replica NMOS transistor 130 to generate the low bias voltage 70, and the adjusted reference current 118 is applied to second replica NMOS transistor 132 coupled in series with an $R_{DEGEN}$ resistance 128 to generate the high bias voltage 72. The first replica NMOS transistor 130 and the second replica NMOS transistor 132 may each replicate (e.g., have the same or similar characteristics) as an offset generation NMOS transistor that may be used in receiver circuitry of a memory device, such as in the DFE circuitry 50 of the memory device 10. Similarly, the degenerated resistor may have a configurable resistance that causes a voltage drop the replicates an effective voltage ($V_{gs}-V_T$) of the offset generation NMOS transistor. As such, the replica DFE circuitry 120 may replicate circuitry and effective voltages present in the receiver circuitry.

In block 416, the bias voltage generation circuitry 54 may apply the low bias voltage 70 and the high bias voltage 72 to terminals of receiver circuitry, such as a DAC that supplies offset voltages to DFE circuitry 50. For example, the low bias voltage 70 and the high bias voltage 72 may be supplied to the resistor string DAC 68 via the buffers 71 and 73, respectively. Based on the voltage gradient of the set of resistors and one or more digital inputs, the resistor string DAC 68 may generate one or more taps 69 for multiplexer circuitry 75, and the multiplexer circuitry 75 may provide offset voltages 62 for the DFE 52 based on (e.g., by decoding) the one or more taps 69. As mentioned herein, the multiplexer circuitry 75 may include a corresponding multiplexer cell for each of the taps 69 generated by the resistor string DAC 69, and each of the corresponding multiplexer cells may provide an offset voltage of one or more offset voltages 62 to the DFE 52. Each of the taps 69 may correspond to an input tap used by the DFE 52, and the multiplexer circuitry 69 may provide an offset voltage corresponding to the input tap.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device, comprising:
- a resistor string digital to analog convertor (DAC) configured to supply one or more offset voltages to a decision feedback equalizer (DFE) based on a high bias voltage and a low bias voltage;
- bias voltage generation circuitry configured to:
  - generate a reference current based on an offset voltage range trim;
  - generate a first correction current based on a detected temperature change;
  - generate a second correction current based on a supplied voltage, a reference voltage of the memory device, and a supply correction trim;
  - generate an adjusted reference current based on the reference current, the first correction current, and the second correction current;
  - generate the high bias voltage based on the adjusted reference current;
  - generate the low bias voltage based on the reference current; and
  - supply the high bias voltage and the low bias voltage to the resistor string DAC.

2. The memory device of claim 1, wherein the bias voltage generation circuitry is configured to generate the adjusted reference current based on the reference current, the first correction current, and the second correction current by summing the reference current, the first correction current, and the second correction current to form the adjusted reference current.

3. The memory device of claim 1, wherein the bias voltage generation circuitry is configured to detect the detected temperature change based on a change in a threshold voltage of one or more N-channel metal-oxide semiconductor (NMOS) transistors.

4. The memory device of claim 1, wherein the bias voltage generation circuitry is configured to generate the high bias voltage based on the adjusted reference current by applying the adjusted reference current to an NMOS transistor in series with a replica resistance.

5. The memory device of claim 4, wherein the NMOS transistor replicates an offset generation NMOS transistor of the DFE.

6. The memory device of claim 5, wherein the replica resistance is configured to cause a voltage drop that replicates an effective voltage of the offset generation NMOS transistor in response to the adjusted reference current being applied to the NMOS transistor in series with the replica resistance.

7. The memory device of claim 6, wherein the bias voltage generation circuitry is configured to generate the reference current based on an additional resistance, wherein the additional resistance and the replica resistance are configured to change at the same rate in response to a change in temperature.

8. The memory device of claim 1, wherein the bias voltage generation circuitry is configured to generate the second correction current based on one or more mode selection signals indicating a proportional to absolute temperature (PTAT) or complementary to absolute temperature (CTAT) mode.

9. The memory device of claim 8, wherein the bias voltage generation circuitry is configured to receive the one or more mode selection signals at a multiplexer and gating inputs of one or more NMOS transistors.

10. A method, comprising:

generating a reference current based on a reference voltage of a memory device and an offset voltage range trim;

generating a temperature adjustment current based on a detected temperature;

generating a supply adjustment current based on a supplied voltage and the reference voltage of the memory device;

adjusting the reference current based on the temperature adjustment current and the supply adjustment current;

applying the adjusted reference current to a first N-channel metal-oxide semiconductor (NMOS) transistor and a second resistance in series to form a first bias voltage;

applying the adjusted reference current to a second NMOS transistor to form a second bias voltage; and supplying the first bias voltage and the second bias voltage to receiver circuitry of the memory device.

11. The method of claim 10, wherein generating the supply adjustment current is based at least in part on a supply correction trim.

12. The method of claim 10, wherein the reference voltage comprises a bandgap voltage of the memory device.

13. The method of claim 10, wherein the offset voltage range trim indicates a threshold voltage of a decision feedback equalizer (DFE) of the memory device.

14. The method of claim 10, wherein generating the supply adjustment current based on the supplied voltage and the reference voltage of the memory device comprises comparing the supplied voltage to the reference voltage of the memory device.

15. The method of claim 14, wherein comparing the supplied voltage to the reference voltage of the memory device comprises providing the supplied voltage and the reference voltage of the memory device, as differential inputs, to a linear transconductance amplifier (OTA).

16. The method of claim 10, wherein the supply adjustment current is generated based on the reference current.

17. A memory device, comprising:

bias voltage generation circuitry configured to:

generate a reference current based on offset voltage range trim;

generate an adjusted reference current based on the reference current, a temperature adjustment current, and a supply adjustment current; and apply the adjusted reference current to replica decision feedback equalizer (DFE) circuitry to form a high bias voltage and a low bias voltage;

first circuitry configured to generate the temperature adjustment current based on a detected temperature of the memory device; and second circuitry configured to generate the supply adjustment current based on a supplied voltage, a reference voltage of the memory device, and a supply correction trim.

18. The memory device of claim 17, wherein the first circuitry comprises one or more N-channel metal-oxide semiconductor (NMOS) transistors configured to change a threshold voltage based on a change in temperature.

19. The memory device of claim 17, wherein the first circuitry is configured to generate the temperature adjustment current based on a temperature correction trim and the detected temperature of the memory device.

20. The memory device of claim 19, wherein the temperature correction trim and the supply correction trim are set to mitigate process variations of the memory device.

* * * * *